United States Patent
Sasaki

(10) Patent No.: US 10,070,557 B2
(45) Date of Patent: Sep. 4, 2018

(54) ELECTRONIC DEVICE HAVING FAN MOTOR

(71) Applicant: FANUC CORPORATION, Yamanashi (JP)

(72) Inventor: Kazuyuki Sasaki, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 83 days.

(21) Appl. No.: 15/351,573

(22) Filed: Nov. 15, 2016

(65) Prior Publication Data

US 2017/0150644 A1    May 25, 2017

(30) Foreign Application Priority Data

Nov. 20, 2015   (JP) .................................. 2015-227779

(51) Int. Cl.
| | |
|---|---|
| H05K 7/20 | (2006.01) |
| H05K 5/02 | (2006.01) |
| F04D 19/00 | (2006.01) |
| F04D 25/08 | (2006.01) |

(52) U.S. Cl.
CPC ....... *H05K 7/20172* (2013.01); *F04D 19/002* (2013.01); *F04D 25/08* (2013.01); *H05K 5/0213* (2013.01); *F05D 2260/602* (2013.01)

(58) Field of Classification Search
CPC .. H05K 7/20; H05K 5/0213; F05D 2260/602; F04D 19/002
USPC ............... 361/690, 694, 679.49, 679.48, 695
See application file for complete search history.

(56) References Cited

U.S. PATENT DOCUMENTS

2005/0168945 A1*  8/2005  Coglitore ........... H05K 7/20736
                                                       361/695

FOREIGN PATENT DOCUMENTS

| JP | 9172281 A | 6/1997 |
|---|---|---|
| JP | 2005268711 A | 9/2005 |
| JP | 200748946 A | 2/2007 |

OTHER PUBLICATIONS

English Abstract and Machine Translation for Japanese Publication No. 2005-268711 A, published Sep. 29, 2005, 12 pgs.
English Abstract and Machine Translation for Japanese Publication No. 09-172281 A, published Jun. 30, 1997, 11 pgs.
Untranslated Decision to Grant a Patent mailed by Japan Patent Office (JPO) for Application No. JP 2015-227779 dated Oct. 17, 2017, 3 pages.
English machine translation of Decision to Grant a Patent mailed by Japan Patent Office (JPO) for Application No. JP 2015-227779 dated Oct. 17, 2017, 3 pages.
English Abstract and Machine Translation for Japanese Publication No. 2007-048946 A, published Feb. 22, 2007, 10 pgs.

* cited by examiner

*Primary Examiner* — Mandeep S Buttar
(74) *Attorney, Agent, or Firm* — Fredrikson & Byron, P.A.

(57) ABSTRACT

An electronic device according to the present invention includes a fan motor disposed at the upper side of a ventilation hole in an upper wall part of a casing containing an electronic component. A fluid receiving part for receiving fluid is positioned beneath lowermost points of vanes of the fan motor.

6 Claims, 11 Drawing Sheets

ELECTRONIC DEVICE HAVING FAN MOTOR

BACKGROUND OF THE INVENTION

1. Field of the Invention

The present invention relates to an electronic device provided with a fan motor. In particular, the present invention relates to the configuration of an electronic device, in which a fan motor is attached to the top portion of a casing containing electronic components.

2. Description of the Related Art

An electronic device used for, for example, a numerical control device of a machine can be provided with a fan motor for cooling, for example, a control board or electronic components contained in a casing of the electronic device. When such an electronic device is used for a long period of time in a machine factory, moisture or cutting fluid mist contained in air within the factory accumulates on the fan motor. When the fan motor is disposed on the top portion of the casing of the electronic device, the moisture or cutting fluid mist, which has accumulated on the fan motor, turns into droplets and then drops to the inside of the casing, and thereafter, adheres to the control board or the electronic components within the casing. This may cause a short circuit or deterioration of the electronic components in some cases.

Japanese Patent Application Laid-open No. 2007-48946 proposes the structure of an electronic device, in which a fan motor is disposed at the upper side of a ventilation hole formed in the upper wall of a casing. In the structure, a housing for the fan motor is attached to the top face of the upper wall of the casing via a clearance.

FIG. 20 is a top view of the electronic device disclosed in Japanese Patent Application Laid-open No. 2007-48946. FIG. 21 is a sectional view taken along line X-X' in FIG. 20. FIG. 21 also includes an enlarged view of an encircled portion K. FIG. 22 is a view of the inside of the electronic device shown in FIG. 21 when viewed from the direction designated by an arrow Y.

As shown in FIGS. 20 to 22, the electronic device disclosed in Japanese Patent Application Laid-open No. 2007-48946 is provided with a casing 103 containing a control board 102 on which an electronic component 101 is mounted, and a fan motor 104 for cooling the electronic component 101 and the control board 102 within the casing 103. The fan motor 104 has a housing 105. The fan motor 104 is disposed on the upper wall of the casing 103 via the housing 105. A ventilation hole 106, through which an airflow generated by the fan motor 104 passes, is formed in the upper wall of the casing 103.

Further, in the electronic device disclosed in Japanese Patent Application Laid-open No. 2007-48946, as shown in FIG. 21, the housing 105 of the fan motor 104 is attached to the upper wall of the casing 103 via a clearance 107. This structure causes most of fluid adhering to the fan motor 104 to move to the inner surface of the housing 105 due to a centrifugal force of the fan motor 104 when the fan motor 104 rotates. Consequently, the fluid flows, as designated by an arrow S in FIG. 21, from the inner surface of the housing 105 to the outer surface of the casing 103 through the clearance 107.

However, the structure of the electronic device disclosed in, for example, Japanese Patent Application Laid-open No. 2007-48946 (see FIGS. 20 to 22) has a problem that will be described below.

When the fan motor 104 stops, as designated by an arrow T in FIG. 21, the fluid remaining on vanes of the fan motor 104 collects at a lowermost point 108 of each vane as time passes. Consequently, a droplet grows at the lowermost point 108 of the vane, and, as designated by an arrow U in FIG. 21, the droplet drops to the inside of the casing 103 and then adheres to the control board 102 or the electronic component 101. Thus, even in the structure of the electronic device disclosed in Japanese Patent Application Laid-open No. 2007-48946, a short circuit or deterioration of the electronic component 101 may arise in some cases.

SUMMARY OF THE INVENTION

The present invention provides an electronic device in which, not only when a fan motor rotates but also when a fan motor stops, fluid dropping from the fan motor can be prevented from adhering to an electronic component within a casing.

According to a first aspect of the present invention, there is provided an electronic device including a casing which has a top wall part in which a ventilation hole is formed and which contains at least an electronic component, a fan motor which is disposed at the upper side of the ventilation hole in the top wall part and which has a housing, and a fluid receiving part which is disposed beneath a lowermost point of a vane of the fan motor and which receives fluid.

According to a second aspect of the present invention, in the electronic device according to the first aspect, the fluid receiving part is formed by setting a radius of the ventilation hole to be smaller than a distance between the center of the ventilation hole and the lowermost point of the fan motor.

According to a third aspect of the present invention, in the electronic device according to the first aspect, the fluid receiving part projects from an inner wall part of the ventilation hole in the radially inward direction of the ventilation hole.

According to a fourth aspect of the present invention, in the electronic device according to the third aspect, the fan motor is a DC fan motor, and the fluid receiving part is disposed only at a position corresponding the lowermost point of the vane of the DC fan motor when the DC fan motor stops.

According to a fifth aspect of the present invention, in the electronic device according to any of the first to fourth aspects, an annular projecting part is provided, along an opening edge of the ventilation hole, on the top face of the top wall part.

According to a sixth aspect of the present invention, in the electronic device according to any of the first to fifth aspects, a clearance is defined between the top face of the top wall part and the housing of the fan motor, and the top wall part has a discharge passage for discharging the fluid from the fluid receiving part to the outside of the housing through the clearance.

According to a seventh aspect of the present invention, in the electronic device according to the sixth aspect, the discharge passage has a gradient for allowing the fluid within the discharge passage to move toward the outside of the housing.

BRIEF DESCRIPTION OF THE DRAWINGS

These objects, features, and advantages of the present invention and other objects, features, and advantages will become further clearer from the detailed description of typical embodiments illustrated in the appended drawings.

DETAILED DESCRIPTION

Figure 1:
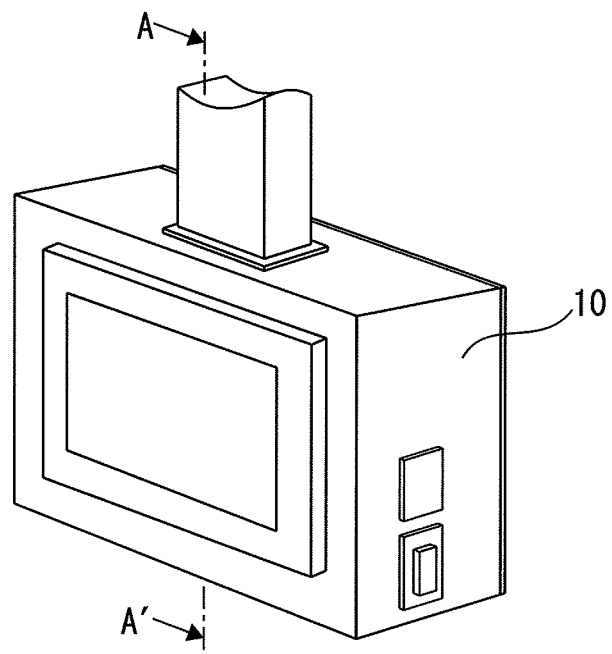
FIG. 1 is a perspective view of a control device provided with an electronic device according to the present invention.

Embodiments of the present invention will be described below with reference to the drawings. In the following figures, similar members are designated with the same reference numerals. The members in the different figures, which are designated with the same reference numerals, are deemed to represent components having the same function. These figures are properly modified in scale to assist the understanding thereof.

Figure 2:
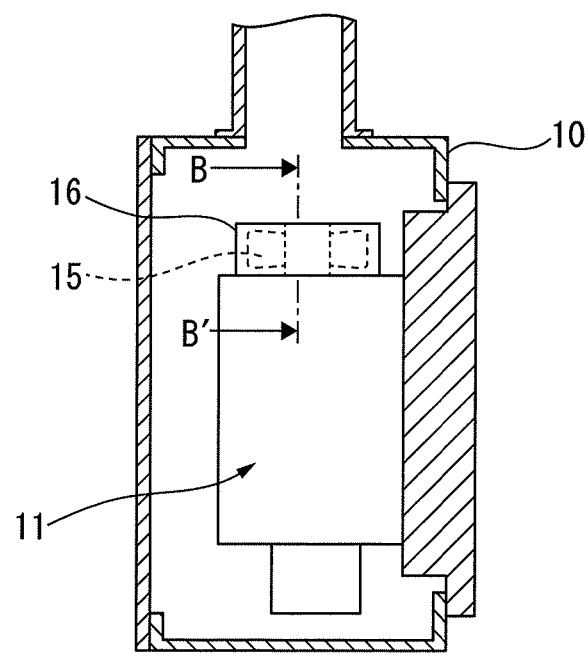
FIG. 2 is a sectional view taken along line A-A' in FIG. 1.

FIG. 1 is a perspective view of a control device provided with an electronic device according to the present invention. FIG. 2 is a sectional view taken along line A-A' in FIG. 1.

A control device 10 shown in FIG. 1 is, for example, a numerical control device board used for controlling a machine tool etc. An electronic device 11 is disposed within the control device 10 as shown in FIG. 2. A fan motor 15 having a housing 16 is disposed on the top portion of the electronic device 11. The housing 16 is referred to as, for example, a case in some cases.

(First Embodiment)

The structure of the electronic device 11 according to a first embodiment will be described in detail.

Figure 3:
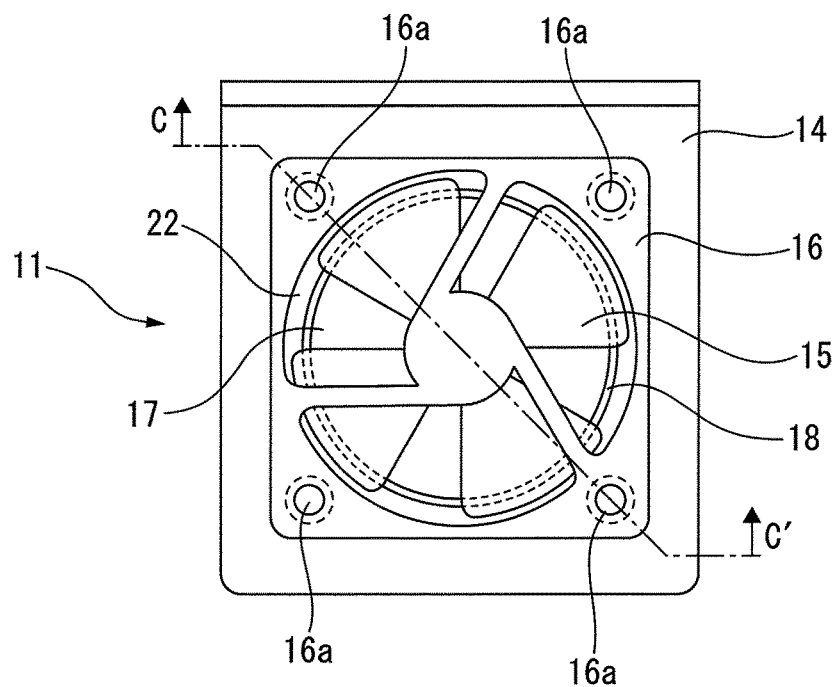
FIG. 3 is a top view of an electronic device disposed within the control device shown in FIG. 2.
Figure 4:
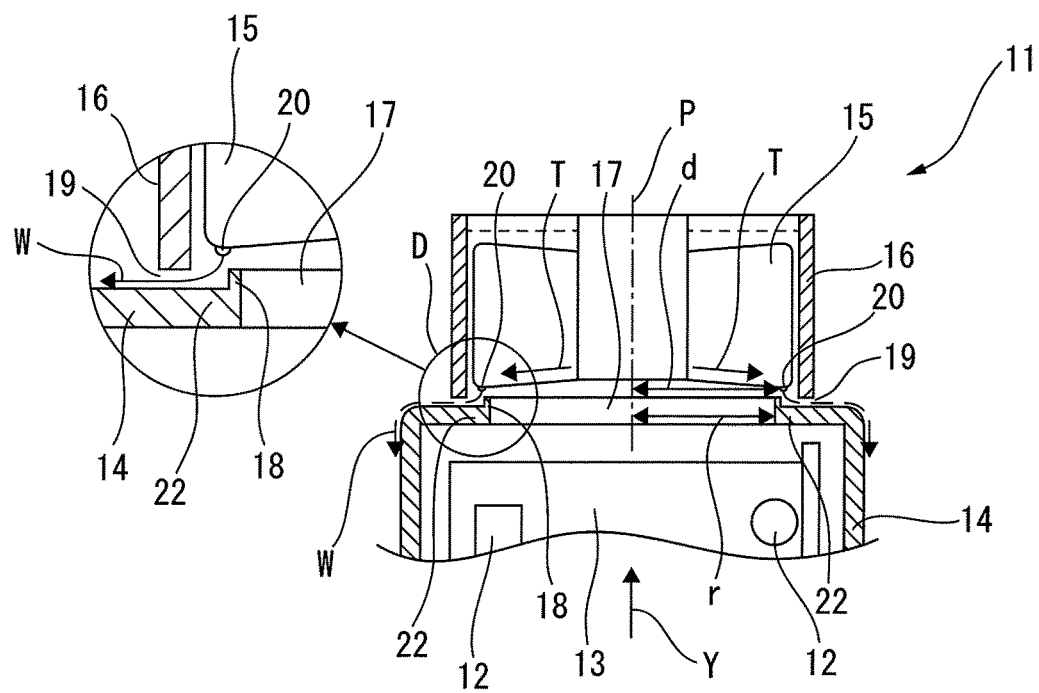
FIG. 4 is a sectional view taken along line B-B' in FIG. 2.
Figure 5:
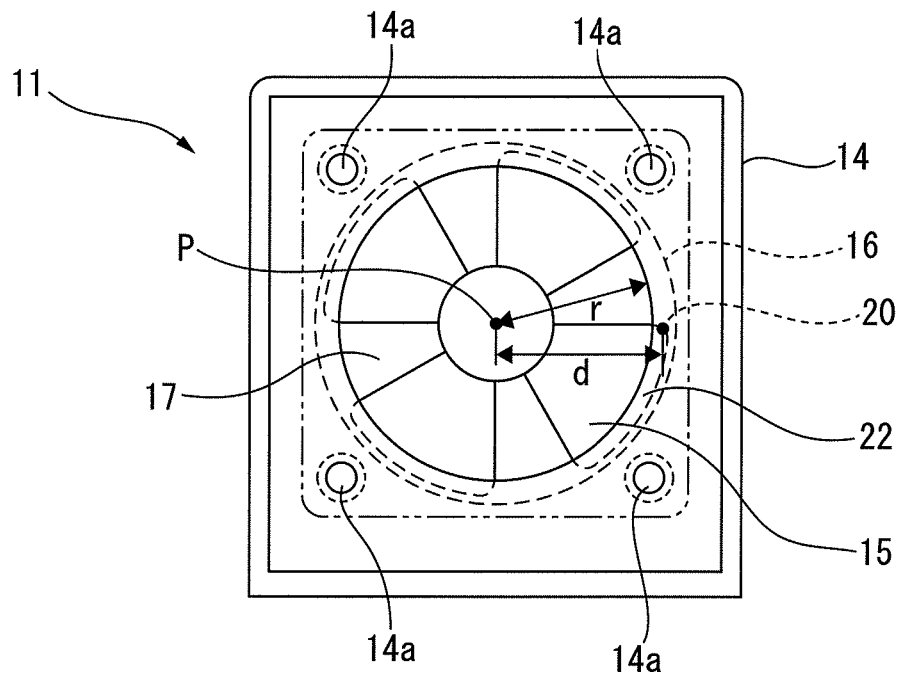
FIG. 5 is a view of the inside of the electronic device when viewed from the direction designated by an arrow Y shown in FIG. 4.

FIG. 3 is a top view of the electronic device 11 according to the first embodiment, which is disposed within the control device 10 shown in FIG. 2. FIG. 4 is a sectional view taken along line B-B' in FIG. 2. FIG. 4 also includes an enlarged view of an encircled portion D. FIG. 5 is a view of the inside of the electronic device 11 shown in FIG. 4 when viewed from the direction designated by an arrow Y.

As shown in FIGS. 3 to 5, the electronic device 11 is provided with a casing 14 containing a control board 13 on which an electronic component 12 is mounted, and a fan motor 15 for cooling an electronic component 12 and a control board 13 within the casing 14. The fan motor 15 has the housing 16.

More specifically, the casing 14 has an upper wall in which a circular ventilation hole 17 is formed, and contains at least the electronic component 12 and the control board 13.

The fan motor 15 having the housing 16 is disposed above the ventilation hole 17 in the upper wall of the casing 14. As can be seen from FIG. 4, the center of a rotary shaft of the fan motor 15 coincides with a center P of the ventilation hole 17.

An annular protrusion 18 is provided, along the opening edge of the ventilation hole 17, on the top face of the upper wall of the casing 14. The annular protrusion 18 is provided to prevent fluid, which has dropped to the top face of the upper wall of the casing 14, from entering the ventilation hole 17.

There is a clearance 19 between the top face of the upper wall of the casing 14 and the housing 16 of the fan motor 15.

As shown in FIGS. 3 to 5, underneath lowermost points 20 of vanes of the fan motor 15, a fluid receiving part 22 for receiving fluid dropping from the lowermost points 20 is positioned. In the first embodiment, as shown in FIGS. 4 and 5, the fluid receiving part 22 is formed by setting the radius r of the ventilation hole 17 to be smaller than the distance d between the center P of the ventilation hole 17 and each of the lowermost points 20 of the vanes of the fan motor 15. In short, the peripheral portion of the ventilation hole 17 corresponds to the fluid receiving part 22. Forming the fluid receiving part 22 as described above enables the fluid receiving part 22 to be easily disposed below the lowermost points 20 of the vanes of the fan motor 15.

Figure 6:
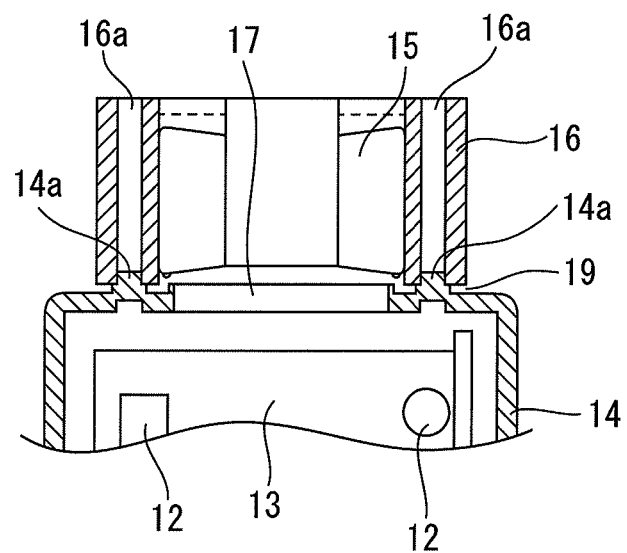
FIG. 6 is a sectional view taken along line C-C' in FIG. 3.

The housing 16 of the fan motor 15 is attached to the upper wall of the casing 14 via the clearance 19. FIG. 6 is a sectional view taken along line C-C' in FIG. 3. As shown in FIGS. 3 and 6, a plurality of through-holes 16a (four through-holes in this embodiment) are formed in the housing 16.

As shown in FIG. 6, stepped projecting parts 14a to be fitted in the corresponding through-holes 16a are provided on the top face of the upper wall of the casing 14. Such stepped projecting parts 14a define the clearance 19 between the top face of the upper wall of the casing 14 and the housing 16.

It is preferable that the housing 16 is secured to the upper wall of the casing 14 by inserting bolts (not shown) into the through-holes 16a and screw-engaging the bolts with the stepped projecting parts 14a. Of course, the method for securing the housing 16 is not limited to the securing method using bolts.

The effect based on the structure of the electronic device 11 in the first embodiment will now be described.

When the fan motor 15 stops, as designated by an arrow T in FIG. 4, the fluid remaining on the vanes of the fan motor 15 collects at the lowermost points 20 of the vanes as time passes. Consequently, droplets grow at the lowermost points 20 of the vanes and then drop. The dropped droplets are received by the fluid receiving part 22, i.e., the peripheral portion of the ventilation hole 17 in the top face of the upper wall of the casing 14.

The fluid received by the fluid receiving part 22 is regulated by the annular protrusion 18, to flow, as designated by an arrow W in FIG. 4, along the outer surface of the casing 14 via the clearance 19, outside the housing 16, without entering the ventilation hole 17. Thus, if droplets drop from the fan motor 15 when the fan motor 15 stops, the droplets would not adhere to the electronic component 12 or the control board 13 within the casing 14. This prevents a failure, for example, a short circuit or deterioration of the electronic component 12.

In contrast, when the fan motor 15 rotates, most of the fluid adhering to the fan motor 15 moves to the inner surface of the housing 16 due to a centrifugal force generated by the rotation of the fan motor 15. Consequently, the fluid flows along the inner surface of the housing 16 and then drops to the top face of the upper wall of the casing 14. After that, in a manner similar to when the fan motor 15 stops, the fluid, which has dropped, flows along the outer surface of the casing 14 via the clearance 19, outside the housing 16.

A modification of the electronic device 11 in the first embodiment will now be described.

Figure 7:
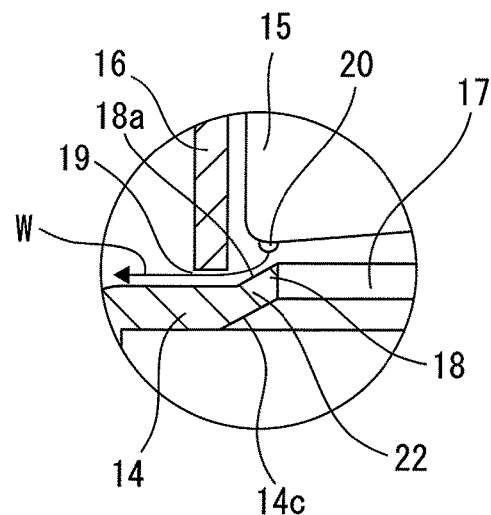
FIG. 7 is a view of a modification of a portion D shown in FIG. 4.

FIG. 7 is a view of a modification of a portion D shown in FIG. 4. As described above using FIG. 4, the droplets dropping from the lowermost points 20 of the vanes of the fan motor 15 are received by the peripheral portion of the ventilation hole 17, i.e., the fluid receiving part 22 in the upper wall of the casing 14. In this respect, in order to prevent the fluid adhering to the top face of the upper wall of the casing 14 from entering the ventilation hole 17, it is preferable that the fluid is reliably moved away from the ventilation hole 17. Thus, as shown in FIG. 7, it is preferable that the outer peripheral surface of the annular protrusion 18 has an inclined surface 18a inclined outward from the top end to the bottom end of the annular protrusion 18.

As shown in FIG. 7, it is preferable that the tip end of the annular protrusion 18 has an acute angle, the radius r of the ventilation hole 17 is large, and an inclined surface 14c is formed at the opening edge of the ventilation hole 17 in the bottom surface of the upper wall of the casing 14. In this structure, resistance to airflow from the inside of the casing 14 toward the fan motor 15 through the ventilation hole 17 can be reduced.

Figure 8:
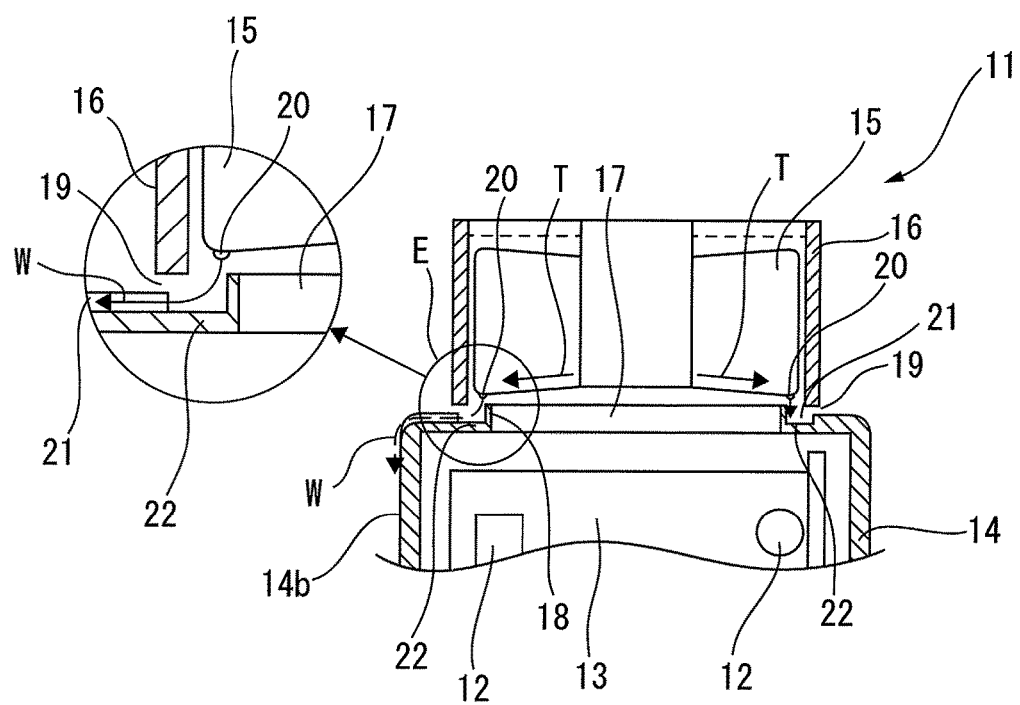
FIG. 8 is a view of a first modification of the section taken along line B-B' in FIG. 2.
Figure 9:
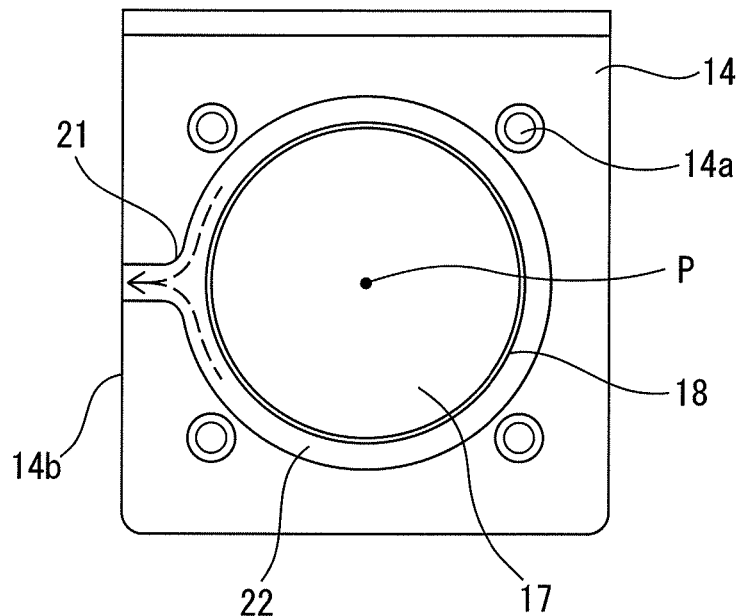
FIG. 9 is a view of the top face of the upper wall of a casing from which a fan motor and a housing shown in FIG. 8 are removed.

In the first embodiment, it is preferable that the upper wall of the casing 14 has a discharge passage 21 through which fluid is discharged from the fluid receiving part 22 to the outside of the housing 16 via the clearance 19. FIG. 8 is a view of a first modification of the section taken along line B-B' in FIG. 2. FIG. 8 also includes an enlarged view of an encircled portion E. FIG. 9 is a view of the top face of the upper wall of the casing 14, from which the fan motor 15 and the housing 16 described in FIG. 8 are removed.

As shown in FIGS. 8 and 9, a groove is formed, along the outer periphery of the annular protrusion 18, at a position corresponding to the fluid receiving part 22 in the top face of the upper wall of the casing 14, and the discharge passage 21 is provided by extending the outlet part of the groove to a side 14b of the casing 14. This kind of discharge passage 21 is allowed to directly receive droplets dropping from the lowermost points 20 of the vanes of the fan motor 15, and to discharge the received droplets toward the side 14b of the casing 14. In other words, providing the discharge passage 21 enables the discharge direction of the fluid received by the fluid receiving part 22 of the upper wall of the casing 14 to be set at a desired direction.

Figure 10:
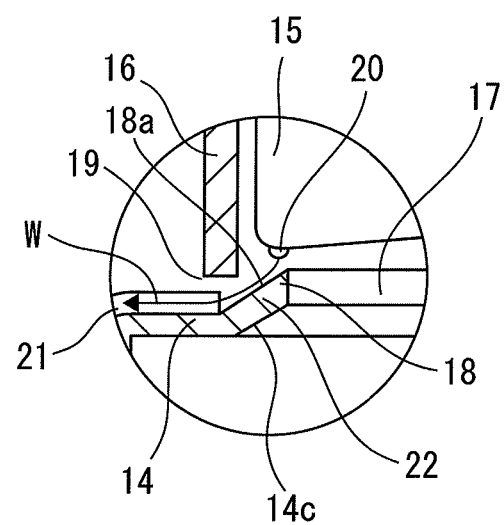
FIG. 10 is a view of a modification of a portion E shown in FIG. 8.

FIG. 10 is a view of a modification of an encircled portion E shown in FIG. 8. Even when the discharge passage 21 is provided as described above, as shown in FIG. 10, it is preferable that the outer peripheral surface of the annular protrusion 18 has the inclined surface 18a which is inclined outward from the top end to the bottom end of the annular protrusion 18.

Figure 11:
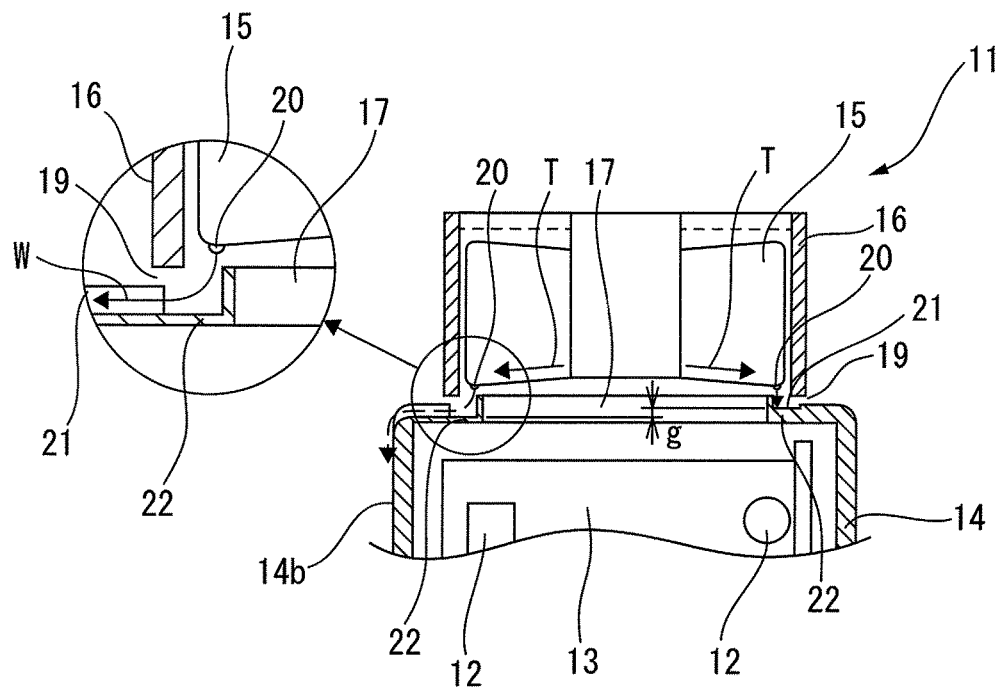
FIG. 11 is a view of a second modification of the section taken along line B-B' in FIG. 2.

FIG. 11 is a second modification of the section taken along line B-B' in FIG. 2. As shown in FIG. 11, it is preferable that the discharge passage 21 has a gradient g for allowing the fluid in the groove constituting the discharge passage 21 to move toward the side 14b of the casing 14 outside the housing 16. This enables the discharge passage 21 to smoothly discharge fluid.

(Second Embodiment)

A second embodiment of the present invention will now be described. Note that, in the following description, features different from those of the first embodiment will be mainly described, and components identical to those of the first embodiment are designated with the same reference numerals, and accordingly, the description of these components is omitted.

Figure 12:
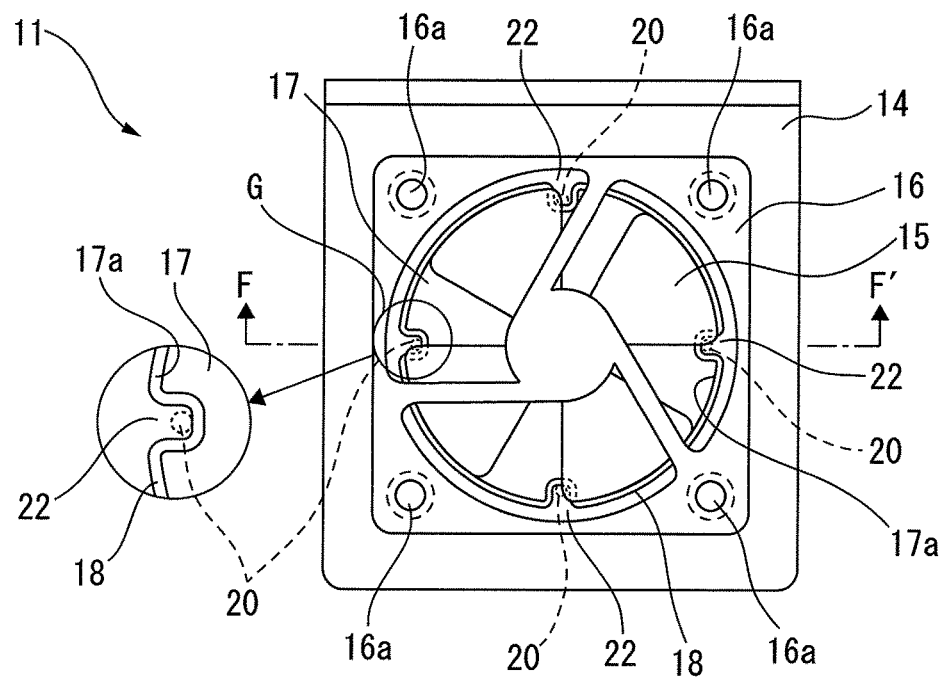
FIG. 12 is a top view of an electronic device according to a second embodiment.
Figure 13:
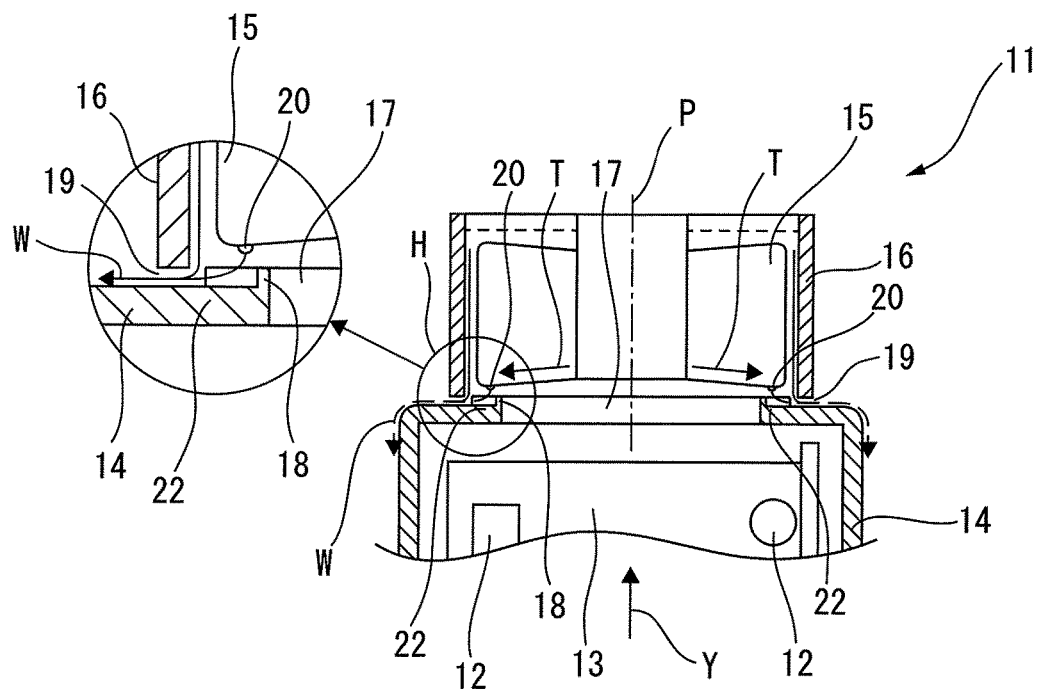
FIG. 13 is a sectional view taken along line F-F' in FIG. 12.
Figure 14:
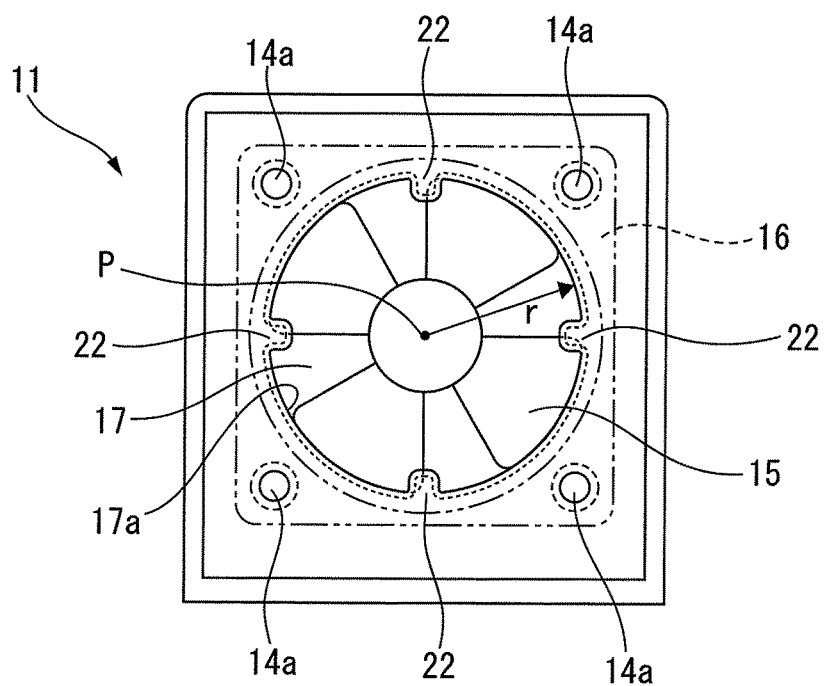
FIG. 14 is a view of the inside of the electronic device when viewed from the direction designated by an arrow Y shown in FIG. 13.

FIG. 12 is a top view of an electronic device 11 according to the second embodiment. FIG. 12 also includes an enlarged view of an encircle portion G. FIG. 13 is a sectional view taken along line F-F' in FIG. 12. FIG. 13 also includes an enlarged view of an encircled portion H. FIG. 14 is a view of the inside of the electronic device 11 when viewed from the direction designated by an arrow Y shown in FIG. 13.

In the electronic device 11 in the first embodiment, there is no limitation in the type of the fan motor 15. In contrast, the electronic device 11 according to the second embodiment is preferable for the fan motor 15 that is a DC fan motor.

In the case of the DC fan motor, when the DC fan motor stops, vanes of the DC fan motor always stop at predetermined positions. In other words, in the case of the DC fan motor, when the DC fan motor stops, lowermost points 20 of the vanes are always positioned at the same positions.

Thus, in the second embodiment, as shown in FIGS. 12 to 14, fluid receiving parts 22 are disposed only at positions corresponding to the lowermost points 20 of the vanes of the DC fan motor when the DC fan motor stops. Each fluid receiving part 22 projects from an inner wall part 17a of a ventilation hole 17 in the radially inward direction of the ventilation hole 17.

The other features are identical to those of the electronic device 11 in the first embodiment.

The effect based on the structure of the electronic device 11 in the second embodiment will now be described.

When the fan motor 15 stops, as designated by an arrow T in FIG. 13, fluid remaining on the vanes of the fan motor 15 collects at the lowermost points 20 of the vanes as time passes. Consequently, droplets grow at the lowermost points 20 of the vanes and then drop. In the second embodiment, the fan motor 15 is a DC fan motor, and the fluid receiving parts 22 project from the inner wall part of the ventilation hole 17 toward positions corresponding to the lowermost points 20 of the vanes of the DC fan motor when the DC fan motor stops. This causes the droplets that have dropped from the lowermost points 20 of the stopping DC fan motor to be received by the fluid receiving parts 22.

The fluid received by the fluid receiving parts 22 is regulated by the annular protrusion 18, to flow, as designated by an arrow W in FIG. 13, along the outer surface of the casing 14 via the clearance 19, outside the housing 16, without entering the ventilation hole 17. Thus, if droplets drop from the fan motor 15 when the fan motor 15 stops, the droplets would not adhere to the electronic component 12 or the control board 13 within the casing 14. This prevents a failure, for example, a short circuit or deterioration of the electronic component 12.

In contrast, when the fan motor 15 rotates, most of the fluid adhering to the fan motor 15 moves to the inner surface of the housing 16 due to a centrifugal force generated by the rotation of the fan motor 15. Consequently, the fluid flows along the inner surface of the housing 16 and then drops to the top face of the upper wall of the casing 14. After that, in a manner similar to when the fan motor 15 stops, the dropped fluid flows along the outer surface of the casing 14 via the clearance 19, outside the housing 16.

In the second embodiment, in order to prevent the droplets from adhering to the electronic component 12 or the control board 13, it is only required to position the fluid receiving parts 22 beneath the lowermost points 20 of the vanes of the fan motor 15. Thus, the opening size (diameter 2r) of the ventilation hole 17 can be set to be larger than the outer diameter of the fan motor 15 including the vanes. This causes the flow resistance in the ventilation hole 17 to be smaller than that in the structure of the first embodiment, and reduces a load on the fan motor 15.

A modification of the electronic device 11 in the second embodiment will now be described.

Figure 15:
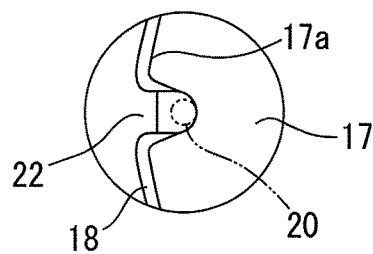
FIG. 15 is a view of a modification of a portion G shown in FIG. 12.
Figure 16:
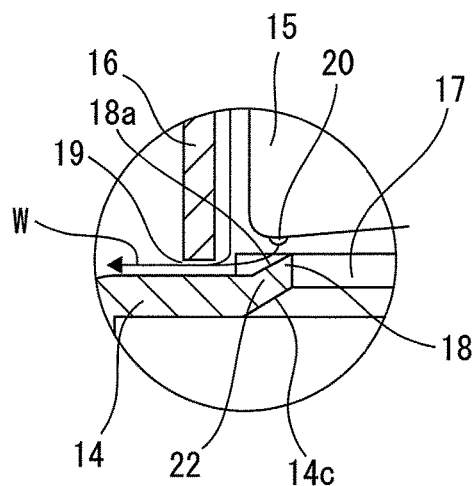
FIG. 16 is a view of a modification of a portion H shown in FIG. 13.

FIG. 15 is a view of a modification of an encircled portion G in FIG. 12. FIG. 16 is a view of a modification of an encircled portion H in FIG. 13. As described above using FIG. 13, the droplets that have dropped from the lowermost points 20 of the vanes of the fan motor 15 are received by the fluid receiving parts 22 projecting from the inner wall part of the ventilation hole 17. In this respect, in order to prevent fluid adhering to the top face of the upper wall of the casing 14 from entering the ventilation hole 17, it is preferable that the fluid is reliably moved away from the ventilation hole 17. Thus, it is preferable that, as shown in FIGS. 15 and 16, the outer peripheral surface of the annular protrusion 18 has an inclined surface 18a inclined outward from the top end to the bottom end of the annular protrusion 18.

It is also preferable that, as shown in FIG. 16, the tip end of the annular protrusion 18 has an acute angle, and projects by a small amount in the radially inward direction of the ventilation hole 17, and an inclined surface 14c is formed at the opening edge of the ventilation hole 17 in the bottom surface of the upper wall of the casing 14. In this structure, resistance to airflow from the inside of the casing 14 toward the fan motor 15 through the ventilation hole 17 can be reduced.

Figure 17:
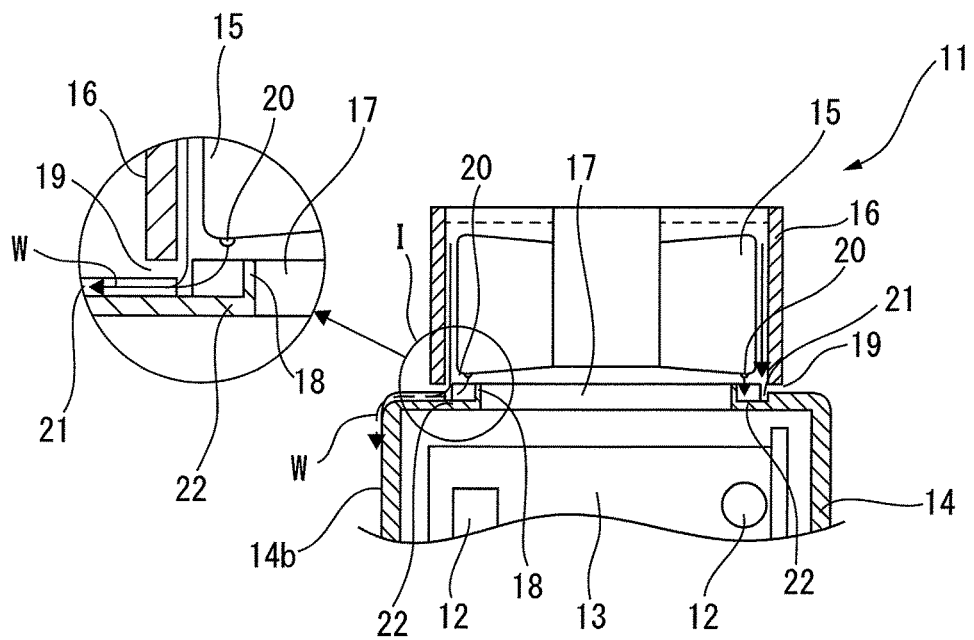
FIG. 17 is a view of a first modification of the section taken along line F-F' in FIG. 12.
Figure 18:
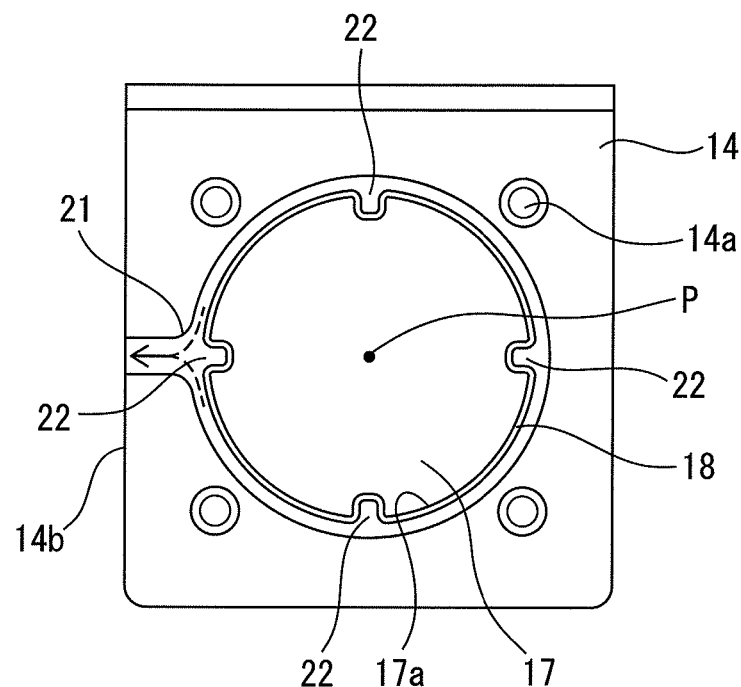
FIG. 18 is a view of the top face of the upper wall of a casing from which a fan motor and a housing shown in FIG. 17 are removed.

In the second embodiment, in a manner similar to the first embodiment, it is preferable that the upper wall of the casing 14 has a discharge passage 21 through which fluid is discharged from the fluid receiving parts 22 to the outside of the housing 16 via the clearance 19. FIG. 17 is a view of a first modification of the section taken along line F-F' in FIG. 12. FIG. 17 also includes an enlarged view of an encircled portion I. FIG. 18 is a view of the top face of the upper wall of the casing 14, from which the fan motor 15 and the housing 16 in FIG. 17 are removed.

As shown in FIGS. 17 and 18, a groove is formed, along the outer periphery of the annular protrusion 18, in the top face of the upper wall of the casing 14, and the discharge passage 21 is provided by extending the outlet part of the groove to a side 14b of the casing 14. Further, the fluid receiving parts 22 communicate with the discharge passage 21. This kind of discharge passage 21 is allowed to receive droplets dropping from the lowermost points 20 of the vanes of the fan motor 15, via the fluid receiving parts 22, and to discharge the received droplets toward the side 14b of the casing 14. In other words, providing the discharge passage 21 enables the discharge direction of the fluid received by the fluid receiving parts 22 of the upper wall of the casing 14 to be set at a desired direction. Note that, in an example of the structure shown in FIGS. 17 and 18, it is preferable to provide an inclined surface 18a shown in, for example, FIGS. 15 and 16.

Figure 19:
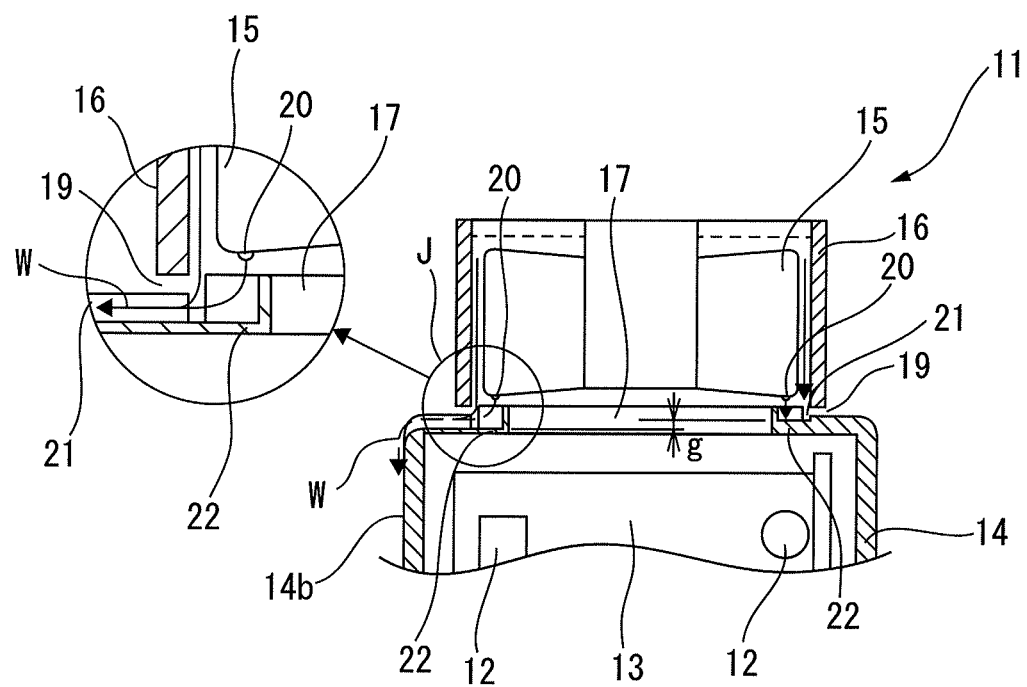
FIG. 19 is a view of a second modification of the section taken along line F-F' in FIG. 12.
Figure 20:
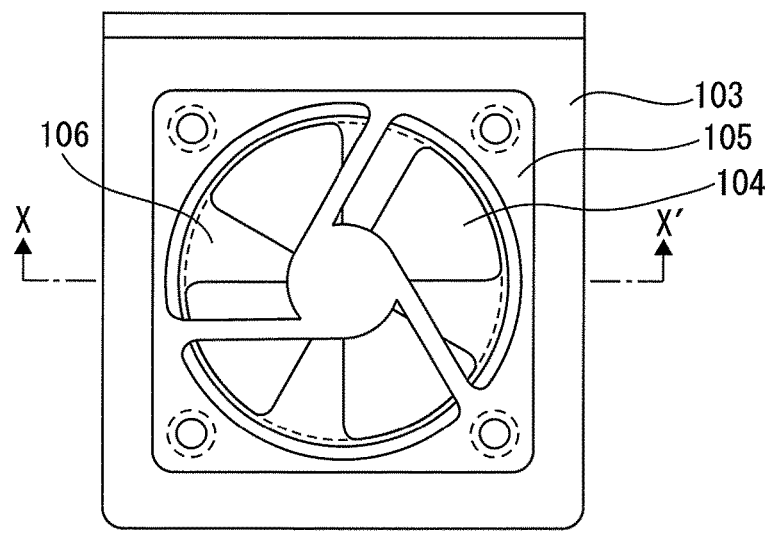
FIG. 20 is a top view of an electronic device disclosed in Japanese Patent Application Laid-open No. 2007-48946.
Figure 21:
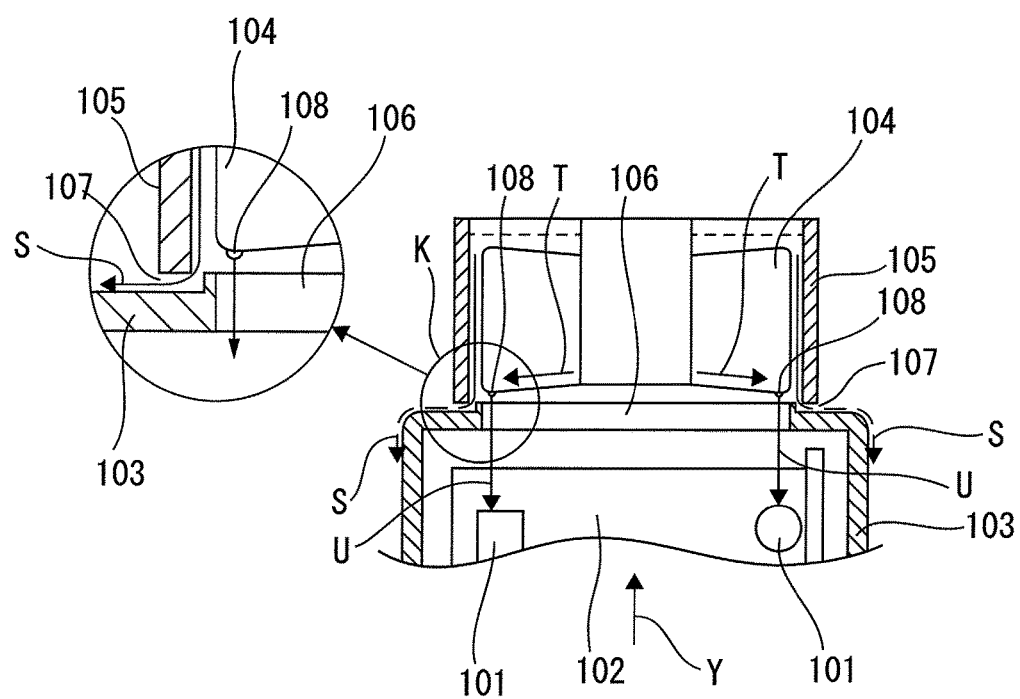
FIG. 21 is a sectional view taken along line X-X' in FIG. 20.
Figure 22:
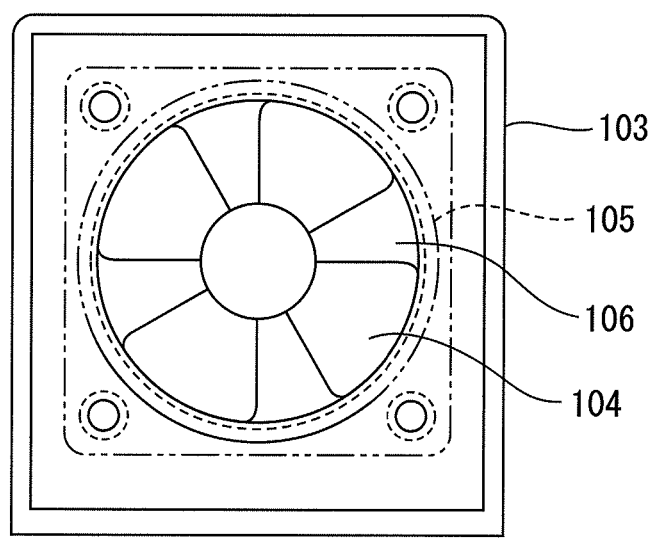
FIG. 22 is a view of the inside of the electronic device when viewed from the direction designated by an arrow Y shown in FIG. 21.

FIG. 19 is a view of a second modification of the section taken along line F-F' in FIG. 12. FIG. 19 also includes an enlarged view of an encircled portion J. As shown in FIG. 19, it is preferable that the discharge passage 21 has a gradient g for allowing the fluid in the groove constituting the discharge passage 21 to move toward the side 14b of the casing 14 outside the housing 16. This enables the discharge passage 21 to smoothly discharge fluid.

In the first and second embodiments described above, the electronic device 11 in which the clearance 19 is defined between the top face of the upper wall of the casing 14 and the housing 16 of the fan motor 15 (see FIGS. 4, 13, etc.). However, the invention of this application includes an electronic device 11 having no clearance 19.

The present invention has been described above using exemplary embodiments. However, a person skilled in the art would understand that the aforementioned modifications and various other modifications, omissions, and additions can be made without departing from the scope of the present invention. Further, an appropriate combination of the above-described embodiments is included in the scope of the present invention.

Effect of the Invention

According to the first aspect of the present invention, a fluid receiving part for receiving fluid is positioned beneath lowermost points of vanes of a fan motor, and accordingly, droplets dropping from the fan motor when the fan motor stops can be prevented from adhering to, for example, an electronic component within an electronic device. This prevents, for example, a short circuit or deterioration of the electronic component.

According to the second aspect of the present invention, the fluid receiving part can be easily disposed beneath the lowermost points of the vanes of the fan motor.

In, particularly, the third and fourth aspects of the present invention, it is only required to dispose the fluid receiving part beneath the lowermost points of the vanes of the fan motor, and accordingly, the opening size of the ventilation hole can be set to be larger than the outer diameter of the fan motor including the vanes. This causes the flow resistance in the ventilation hole to be smaller than that in the structure of the first and second embodiments, and reduces a load on the fan motor.

According to the fifth aspect of the present invention, providing an annular projecting part along the opening edge of the ventilation hole prevents the fluid received by the fluid receiving part from entering the ventilation hole.

According to the sixth aspect of the present invention, the discharge direction of the fluid received by the fluid receiving part in the upper wall part of a casing can be set to be a desired direction by a discharge passage.

According to the seventh aspect of the present invention, the fluid within the discharge passage can be smoothly discharged toward a side of the casing outside the housing by a gradient provided in the discharge passage.

What is claimed is:

1. An electronic device comprising: a casing which has a upper wall part in which a ventilation hole is formed and which contains at least an electronic component; a fan motor which is disposed at the upper side of the ventilation hole in the upper wall part and which has a housing; and a fluid receiving part which is disposed beneath a lowermost point of a vane of the fan motor and which receives fluid, and wherein the fluid receiving part is formed by setting a radius of the ventilation hole to be smaller than a distance between the center of the ventilation hole and the lowermost point of a vane of the fan motor.

2. The electronic device according to claim 1, wherein the fluid receiving part projects from an inner wall part of the ventilation hole in the radially inward direction of the ventilation hole.

3. The electronic device according to claim 2, wherein the fan motor is a DC fan motor, and
the fluid receiving part is disposed only at a position corresponding the lowermost point of the vane of the DC fan motor when the DC fan motor stops.

4. The electronic device according to claim 1, wherein an annular projecting part is provided, along an opening edge of the ventilation hole, on the top face of the upper wall part.

5. The electronic device according to claim 1, wherein
a clearance is defined between the top face of the upper wall part and the housing of the fan motor, and
the upper wall part has a discharge passage for discharging the fluid from the fluid receiving part to the outside of the housing through the clearance.

6. The electronic device according to claim 5, wherein the discharge passage has a gradient for allowing the fluid within the discharge passage to move toward the outside of the housing.

* * * * *